(12) United States Patent
Fan et al.

(10) Patent No.: US 11,081,566 B2
(45) Date of Patent: Aug. 3, 2021

(54) SELF-ALIGNED CONTACTS FOR VERTICAL FIELD EFFECT TRANSISTORS

(71) Applicant: INTERNATIONAL BUSINESS MACHINES CORPORATION, Armonk, NY (US)

(72) Inventors: Su Chen Fan, Cohoes, NY (US); Ekmini A. De Silva, Slingerlands, NY (US); Sivananda K. Kanakasabapathy, Pleasanton, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 34 days.

(21) Appl. No.: 16/354,506

(22) Filed: Mar. 15, 2019

(65) Prior Publication Data

US 2020/0295156 A1 Sep. 17, 2020

(51) Int. Cl.
*H01L 29/66* (2006.01)
*H01L 29/78* (2006.01)
*H01L 29/417* (2006.01)

(52) U.S. Cl.
CPC .. *H01L 29/66515* (2013.01); *H01L 29/41741* (2013.01); *H01L 29/6653* (2013.01); *H01L 29/66666* (2013.01); *H01L 29/7827* (2013.01)

(58) Field of Classification Search
CPC ........... H01L 29/66666; H01L 29/7827; H01L 29/78642; H01L 21/823487; H01L 29/6656; H01L 21/76897; H01L 29/0649; H01L 29/0653; H01L 29/66795; H01L 21/823431; H01L 21/823475; H01L 21/823821; H01L 21/845; H01L 27/088; H01L 29/42392; H01L 29/66583; H01L 29/66636; H01L 29/7848; H01L 21/76895; H01L 21/823871; H01L 21/823885; H01L 27/0207; H01L 27/1104; H01L 29/0847; H01L 29/41741; H01L 29/6653; H01L 29/66742; H01L 21/02529; H01L 21/02532; H01L 21/02576; H01L 21/02579; H01L 21/0262; H01L 21/31111; H01L 21/76802; H01L 21/76877; H01L 21/84; H01L 27/1203; H01L 29/0676; H01L 29/41766; H01L 29/66772; H01L 29/78654; H01L 29/78684;
(Continued)

(56) References Cited

U.S. PATENT DOCUMENTS 8,338,254 B2 12/2012 Park et al.
9,251,888 B1 2/2016 Liaw
(Continued)

FOREIGN PATENT DOCUMENTS

KR 101056060 8/2011

*Primary Examiner* — Duy T Nguyen
(74) *Attorney, Agent, or Firm* — Tutunjian & Bitetto, P.C.; Abdy Raissinia

(57) ABSTRACT

Semiconductor devices and methods of forming the same include forming a gate stack in contact with sidewalls of a semiconductor fin and on a bottom spacer over a bottom source/drain region. An encapsulating material is selectively deposited over the gate stack, leaving the bottom spacer exposed. An inter-layer dielectric is formed over the encapsulating material. A via is formed in the inter-layer dielectric to contact the bottom source/drain layer.

13 Claims, 3 Drawing Sheets

(58) Field of Classification Search
CPC ....... H01L 29/78696; H01L 2029/7858; H01L 21/308; H01L 21/743; H01L 21/76224; H01L 21/823418; H01L 21/823437; H01L 23/485; H01L 29/42356; H01L 29/4236; H01L 29/45; H01L 29/4966; H01L 29/4983; H01L 29/517; H01L 29/518; H01L 29/665; H01L 29/66545; H01L 29/66787; H01L 29/7851; H01L 29/66515; H01L 29/42376
USPC ......................................................... 257/329
See application file for complete search history.

(56) References Cited

U.S. PATENT DOCUMENTS

| | | | |
|---|---|---|---|
| 9,312,383 B1* | 4/2016 | Cheng | H01L 21/84 |
| 9,761,491 B1 | 9/2017 | Huang et al. | |
| 9,941,378 B2 | 4/2018 | Basker et al. | |
| 10,020,381 B1* | 7/2018 | Fan | H01L 21/76895 |
| 2007/0018207 A1* | 1/2007 | Prinz | H01L 29/66825 |
| | | | 257/288 |
| 2011/0084314 A1* | 4/2011 | Or-Bach | H01L 29/66621 |
| | | | 257/209 |
| 2012/0229709 A1* | 9/2012 | Heald | B81C 1/00269 |
| | | | 348/739 |
| 2015/0217330 A1 | 8/2015 | Haukka et al. | |
| 2017/0148897 A1* | 5/2017 | Cheng | H01L 29/42392 |
| 2018/0090598 A1 | 3/2018 | Xie et al. | |
| 2018/0114859 A1 | 4/2018 | Gluschenkov et al. | |
| 2018/0174969 A1 | 6/2018 | Leobandung | |
| 2019/0043979 A1* | 2/2019 | Liu | H01L 29/66545 |

* cited by examiner

SELF-ALIGNED CONTACTS FOR VERTICAL FIELD EFFECT TRANSISTORS

BACKGROUND

The present invention generally relates to semiconductor device fabrication and, more particularly, to the fabrication of self-aligned contacts for transistors.

The formation of contacts in vertical field effect transistors (VFETs) can be challenging, as overlay shift errors can cause etches to penetrate through protective insulator layers, thereby causing short-circuits between conductive contacts and elements of the VFETs.

SUMMARY

A method of forming a semiconductor device includes forming a gate stack in contact with sidewalls of a semiconductor fin and on a bottom spacer over a bottom source/drain region. An encapsulating material is selectively deposited over the gate stack, leaving the bottom spacer exposed. An inter-layer dielectric is formed over the encapsulating material. A via is formed in the inter-layer dielectric to contact the bottom source/drain layer.

A method of forming a semiconductor device includes forming a gate stack in contact with sidewalls of a semiconductor fin and on a bottom spacer over a bottom source/drain region. An encapsulating material is selectively deposited over the gate stack, leaving the bottom spacer exposed, by forming a self-assembled monolayer that selectively attaches to the bottom spacer and depositing encapsulating material that does not adhere to the self-assembled monolayer. An inter-layer dielectric is formed over the encapsulating material. A via is formed in the inter-layer dielectric to contact the bottom source/drain layer.

A semiconductor device includes a bottom source/drain region. A semiconductor fin is formed on the bottom source/drain region. A gate stack is in contact with sidewalls of the semiconductor fin. An encapsulating layer is formed over the gate stack. A bottom spacer is formed between the encapsulating layer and the bottom source/drain region. The bottom spacer does not extend beyond an area defined by the encapsulating layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention include vertical field effect transistor (VFET) structures that use self-aligned processes to form conductive contacts. A protective layer that is formed over the gate is formed in a self-aligned fashion to prevent deposition of the protective layer over surfaces where the contacts will be formed. In contrast to embodiments that have a protective layer that extends substantially beyond the boundaries of the channel and gate structures, the absence of the protective layer over regions that will have conductive contacts formed in subsequent steps makes it so that the contacts can be formed without an etch through the material of the protective layer. As a result, even in the event that the formation of the conductive contacts is mispositioned, the conductive contact to the bottom source/drain region will not penetrate the protective layer to touch the gate.

Figure 1:
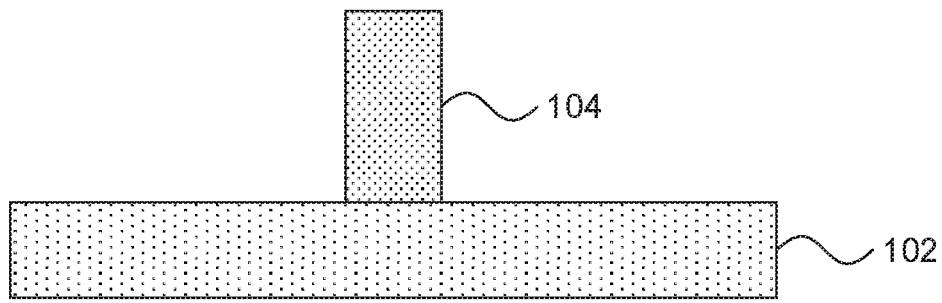
FIG. 1 is a cross-sectional diagram of a step in the formation of a semiconductor device with self-aligned contacts that shows the formation of a semiconductor fin on a bottom source/drain region in accordance with an embodiment of the preset invention.

Referring now to the drawings in which like numerals represent the same or similar elements and initially to FIG. 1, a cross-sectional view of a step in the formation of a VFET is shown. A semiconductor fin 104 is formed on a bottom source/drain region 102. The bottom source/drain region 102 can, in turn, be formed on top of, or from, a semiconductor substrate (not shown) by ion implantation of dopants or by epitaxial growth with in situ doping. Additional semiconductor fins 104 can be formed on the bottom source/drain region 102 as needed. In some embodiments, the bottom source/drain region can be formed by depositing or growing a doped material on an underlying substrate and then annealing, causing the dopant atoms to diffuse into the underlying semiconductor substrate.

The semiconductor substrate may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate may also be a semiconductor on insulator (SOI) substrate.

The semiconductor fin 104 can be formed by any appropriate masking and anisotropic etching process. For example, photolithographic etching can be used to create a mask pattern that forms a hardmask over fin regions. An anisotropic etch, such as reactive ion etching (RIE), can then be used to remove unmasked material. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the semiconductor fin 104 can be formed by spacer imaging transfer.

The present embodiments envision a VFET structure, where a channel structure is positioned between a top source/drain region and a bottom source/drain region. However, it should be understood that the present embodiments can be applied to any appropriate semiconductor structure to limit the formation of a protective dielectric layer outside of a specified region. Thus, although fins are specifically contemplated, alternative semiconductor channel structures can also be used.

Figure 2:
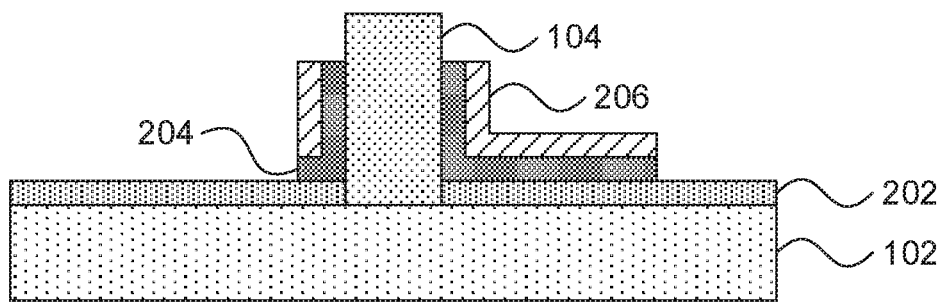
FIG. 2 is a cross-sectional diagram of a step in the formation of a semiconductor device with self-aligned contacts that shows the formation of a bottom dielectric spacer and a gate stack in accordance with an embodiment of the preset invention.

Referring now to FIG. 2, a cross-sectional view of a step in the formation of a VFET is shown. A bottom spacer 202 is formed over the bottom source/drain region 102 from any appropriate dielectric material. For example, the bottom spacer may be formed from silicon nitride or silicon dioxide by a directional deposition process, such as gas cluster ion beam deposition. A brief wet etch can be used to remove any dielectric material that incidentally deposited on the sidewalls of the fin 104.

After formation of the bottom spacer 202, a gate stack is formed in contact with the sidewalls of the semiconductor fin 104. The gate stack includes a gate dielectric 204 and a gate conductor 206. The gate dielectric 204 can be formed from any appropriate dielectric material, but it is specifically contemplated that a high-k dielectric material can be used instead, where "high-k" designates a material having a dielectric constant that is higher than the dielectric constant of silicon dioxide. Exemplary high-k dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 206 can be formed from any appropriate conductive material including, e.g., metals, such as tungsten, nickel, titanium, molybdenum, tantalum, copper, platinum, silver, gold, ruthenium, iridium, rhodium, rhenium, and alloys thereof; and doped semiconductor materials such as, e.g., doped polysilicon. As used through the present disclosure, the term "conductive" denotes a material having a room temperature conductivity of greater than $10-8(\Omega \cdot m)^{-1}$.

The deposition of the gate dielectric 204 and the gate conductor 206 can be performed in subsequent processing steps using a conformal deposition process such as, e.g., chemical vapor deposition (CVD) or atomic layer deposition (ALD). CVD is a deposition process in which a deposited species is formed as a result of chemical reaction between gaseous reactants at greater than room temperature (e.g., between about 25° C. to about 900° C.). The solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. ALD uses self-limiting surface reactions to deposit material layers in the monolayer or sub-monolayer thickness regime. ALD is similar in chemistry to CVD, except that the ALD reaction breaks the CVD reaction into two half-reactions, keeping the precursor materials separate during the reaction. In some embodiments, the ALD process may be a thin film deposition method in which a film is grown on a substrate by exposing its surface to alternate gaseous species (typically referred to as precursors). In contrast to CVD, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

Figure 3:
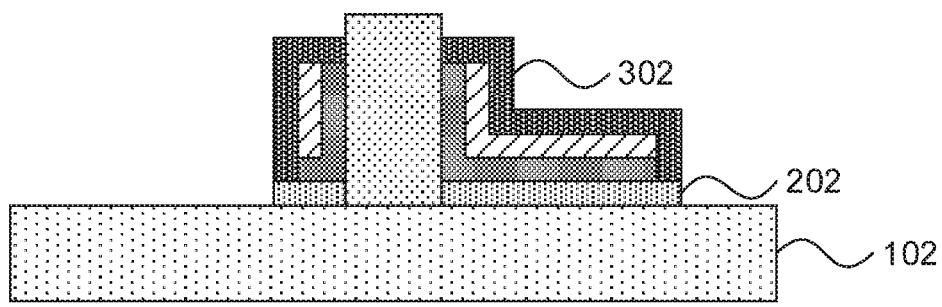
FIG. 3 is a cross-sectional diagram of a step in the formation of a semiconductor device with self-aligned contacts that the selective formation of an encapsulating layer over the gate stack in accordance with an embodiment of the preset invention.

Referring now to FIG. 3, a cross-sectional view of a step in the formation of a VFET is shown. An encapsulating dielectric layer 302 is selectively formed over the gate stack, without covering the bottom spacer 202. Although any manner of selective deposition can be used, it is specifically contemplated that a self-assembled monolayer can be used that binds only to the dielectric material of the bottom spacer 202, but not the material of the gate conductor 206. For example, a self-assembled monolayer that has end functionality that preferentially binds to silicon nitride or silicon dioxide as compared to a gate metal can be used to coat the bottom spacer 202 without being deposited on the gate conductor 206. In one specifically contemplated embodiment, the self-assembled monolayer can have a hydroxyl-based end group.

After the self-assembled monolayer is formed on the bottom spacer 202, the encapsulating dielectric 302 can be formed by any appropriate deposition process, such as chemical vapor deposition (CVD), atomic layer deposition (ALD), physical vapor deposition (PVD), etc. The material of the encapsulating dielectric 302 adheres to the gate conductor 204 without adhering to the self-assembled monolayer. The self-assembled monolayer is then removed using, for example, a hydrogen-based plasma etch.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Once the encapsulating layer 302 is formed, the exposed portions of the bottom spacer 202 are etched away using a selective anisotropic etch. This exposes the top surface of the bottom source/drain region 102 around the encapsulating layer 302. As used herein, the term "selective" in reference to a material removal process denotes that the rate of material removal for a first material is greater than the rate of removal for at least another material of the structure to which the material removal process is being applied.

At this stage, a top source/drain region of the fin 104 can be formed by any appropriate doping process. For example, such doping can include ion implantation or in situ doping through epitaxial growth.

Figure 4:
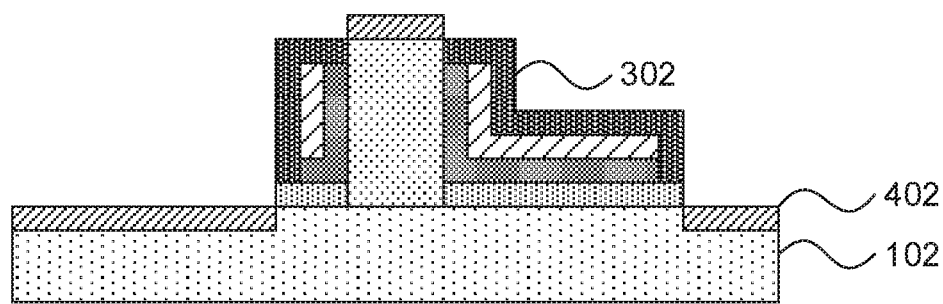
FIG. 4 is a cross-sectional diagram of a step in the formation of a semiconductor device with self-aligned contacts that shows the formation of a metallized layer on exposed semiconductor surfaces in accordance with an embodiment of the preset invention.

Referring now to FIG. 4, a cross-sectional view of a step in the formation of a VFET is shown. A layer of metalized semiconductor 402 is formed on the exposed surfaces of the bottom source/drain regions 102 and the semiconductor fin 104. The metalized semiconductor 402 can be formed by depositing a conductive metal, such as nickel, cobalt, or titanium, using any appropriate deposition process and annealing, causing metal atoms to diffuse into the semiconductor material. In particular embodiments, where silicon is used as the semiconductor material and nickel is used as the conductive metal, the metallized semiconductor 402 can be a silicide layer.

Because the metallized layer 402 is formed by diffusion of metal atoms into the underlying semiconductor material, some lateral diffusion will occur. However, it should be noted that the metallized layer 402 is substantially absent from the region under the encapsulating layer 302, with only a nominal amount of metallization occurring in that region.

Figure 5:
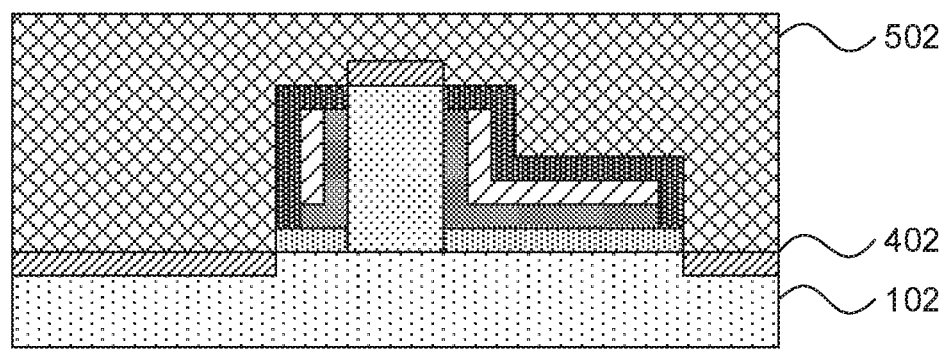
FIG. 5 is a cross-sectional diagram of a step in the formation of a semiconductor device with self-aligned contacts that shows the formation of an inter-layer dielectric in accordance with an embodiment of the preset invention.

Referring now to FIG. 5, a cross-sectional view of a step in the formation of a VFET is shown. An inter-layer dielectric 502 is formed over the structure. The inter-layer dielectric 502 is formed by depositing a dielectric material such as, e.g., silicon dioxide, by any appropriate deposition process, including for example a flowable CVD process. The top surface of the inter-layer dielectric 502 can be polished using a chemical mechanical planarization (CMP) process.

Figure 6:
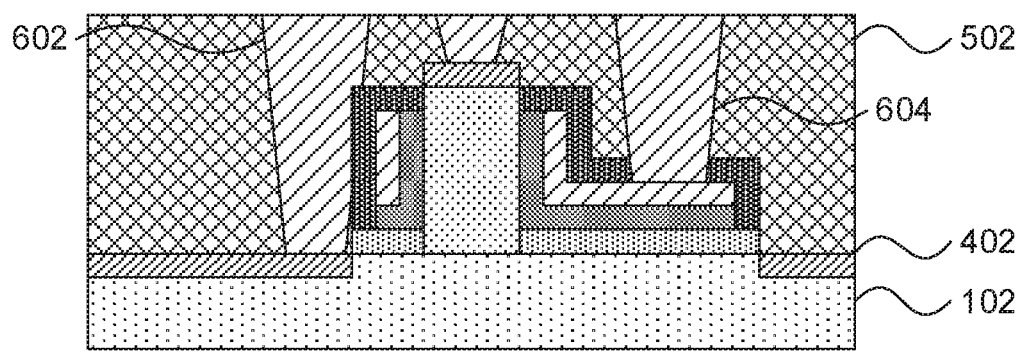
FIG. 6 is a cross-sectional diagram of a step in the formation of a semiconductor device with self-aligned contacts that shows the formation of a conductive contact to a bottom source/drain region that does not need to penetrate the encapsulating layer, thereby preventing short circuits between the conductive contact and the gate conductor, in accordance with an embodiment of the preset invention.

Referring now to FIG. 6, a cross-sectional view of a step in the formation of a VFET is shown. Vias are formed through the inter-layer dielectric 502 to the silicide contacts 402, including a contact to the top source/drain region, a contact 602 to the bottom source/drain region 102, and a contact 604 to the gate conductor 206. Forming the vias includes a first anisotropic etch that selectively penetrates the inter-layer dielectric 502. A second anisotropic etch is used solely for the gate contact 604 and selectively penetrates the encapsulating layer 302. This second etch is not used in the region of the bottom source/drain contact 602, and so the encapsulating layer 302 is not damaged in that region. Thus, even if a mispositioning error occurs, such that the bottom source/drain contact 602 overlaps partially with the gate layer 206, the encapsulating layer 302 will prevent the gate conductor 206 from shorting to the bottom source/drain contact 602.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular form "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 7:
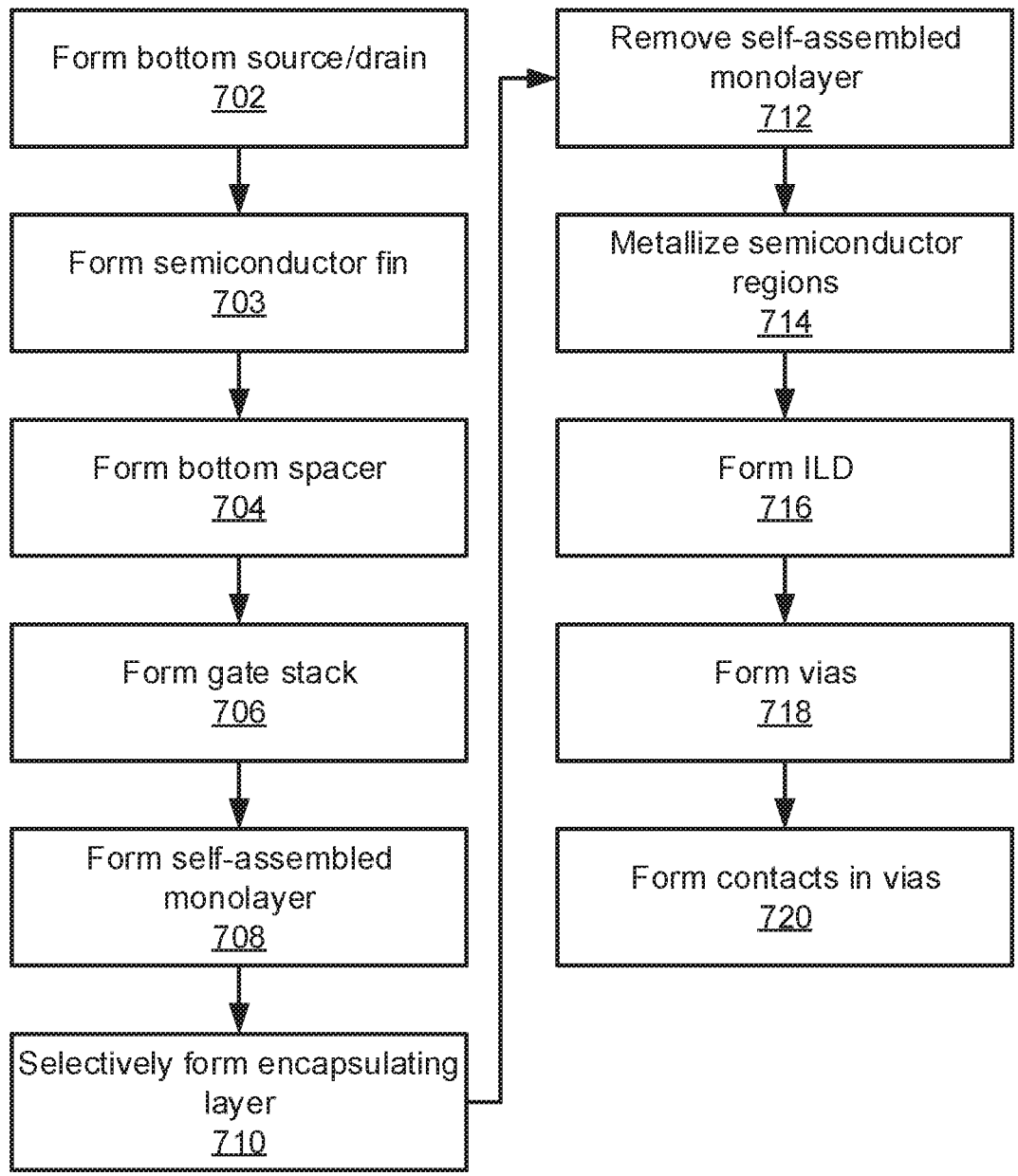
FIG. 7 is a block/flow diagram of a method for forming a semiconductor device with self-aligned contacts in accordance with an embodiment of the present invention.

Referring now to FIG. 7, a process for forming a VFET is shown. Block 702 forms the bottom source/drain region 102 and block 703 forms the semiconductor fin 104. It should be understood that the order of blocks 702 and 703 can be reversed according to the particular processes used to form the respective structures. For example, if the bottom source/drain region 102 is formed by ion implantation, then the semiconductor fin 104 can be formed first to expose the surface of the underlying semiconductor material. If the bottom source/drain region 102 is formed by epitaxial growth with in situ doping, then the semiconductor fin 104 can be formed by etching a layer that is epitaxially grown on top of the bottom source/drain region 102.

Block 704 forms the bottom spacer 202 over the bottom source/drain region 102 from an appropriate dielectric layer. Block 706 then formed the gate stack in contact with the semiconductor fin 104, including gate dielectric layer 204 and gate conductor 206. The gate stack can be formed by sequentially conformally depositing a layer of gate dielectric material and a layer of gate conductor material, masking the region over and around the semiconductor fin 104, and then etching away the exposed portions of the gate stack materials, leaving only the portions covered by the mask. The term "conformal," as used herein, denotes a layer having a thickness that does not deviate by more than 30% greater or less than an average value for the thickness of the layer.

Block 708 forms a self-assembled monolayer 708 that selectively attaches to the material of the bottom spacer 202 and does not attach to the materials of the gate stack. Block 710 selectively forms the encapsulating layer 302 over the gate stack, as the deposited encapsulating dielectric material adheres to the materials of the gate stack, but not to the self-assembled monolayer. Block 712 then removes the self-assembled monolayer.

Block 714 metallizes the exposed semiconductor regions, for example by depositing a conductive metal and then annealing. Block 716 forms an inter-layer dielectric 502 by, e.g., a flowable CVD of an appropriate dielectric, followed by a CMP process. Block 718 forms vias in the inter-layer dielectric 502 using appropriately selective anisotropic etch. In particular, etching a via for the gate contact 604 includes an etch to penetrate the encapsulating layer 302, while etching a via for the bottom source/drain contact 602 omits such an etch to prevent the bottom source/drain contact 602 from shorting to the gate conductor 206 in the event of a mispositioning error. Block 720 then forms the contacts in the vias by depositing a conductive material and polishing down to the height of the inter-layer dielectric 502 using a CMP process.

CMP is performed using, e.g., a chemical or granular slurry and mechanical force to gradually remove upper layers of the device. The slurry may be formulated to be unable to dissolve, for example, the inter-layer dielectric material, resulting in the CMP process's inability to proceed any farther than that layer.

Having described preferred embodiments of a self-aligned contacts for vertical field effect transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a gate stack in contact with sidewalls of a semiconductor fin and on a bottom spacer over a bottom source/drain region;
    selectively depositing an encapsulating material over the gate stack, leaving an upper surface of the bottom spacer exposed;
    forming an inter-layer dielectric over the encapsulating material; and
    forming a via in the inter-layer dielectric to contact the bottom source/drain region.

2. The method of claim 1, wherein selectively depositing the encapsulating material includes forming a self-assembled monolayer that selectively attaches to the bottom spacer.

3. The method of claim 2, wherein the self-assembled monolayer does not attach to material of the gate stack or of the semiconductor fin.

4. The method of claim 2, wherein forming the self-assembled monolayer includes applying a self-assembling material having a hydroxyl-based end group.

5. The method of claim 1, further comprising etching away exposed portions of the bottom spacer after selectively depositing the encapsulating material over the gate stack.

6. The method of claim 5, further comprising metallizing a surface of the bottom source/drain region after etching away the exposed portions of the bottom spacer.

7. The method of claim 1, further comprising forming a second via in the inter-layer dielectric to contact the encapsulating layer and forming an opening in the encapsulating layer for a gate contact.

8. The method of claim 1, further comprising forming a conductive contact in the via that directly contacts the encapsulating material.

9. The method of claim 8, wherein forming the conductive contact comprises forming the conductive contact in direct contact with a top surface of the encapsulating material.

10. A method for forming a semiconductor device, comprising:

forming a gate stack in contact with sidewalls of a semiconductor fin and on a bottom spacer over a bottom source/drain region;

selectively depositing an encapsulating material over the gate stack, leaving the bottom spacer exposed, comprising:

forming a self-assembled monolayer that selectively attaches to an upper surface of the bottom spacer; and depositing encapsulating material that does not adhere to the self-assembled monolayer;

forming an inter-layer dielectric over the encapsulating material; and forming a via in the inter-layer dielectric to contact the bottom source/drain region.

11. The method of claim 10, wherein forming the self-assembled monolayer includes applying a self-assembling material having a hydroxyl-based end group.

12. The method of claim 10, further comprising forming a conductive contact in the via that directly contacts the encapsulating material.

13. The method of claim 12, wherein forming the conductive contact comprises forming the conductive contact in direct contact with a top surface of the encapsulating material.

* * * * *